United States Patent [19]

Hermann

[11] Patent Number: 4,495,479
[45] Date of Patent: Jan. 22, 1985

[54] SELECTIVE WIRING FOR MULTILAYER PRINTED CIRCUIT BOARD

[75] Inventor: Karl Hermann, Endicott, N.Y.

[73] Assignee: International Business Machines Corporation, Armonk, N.Y.

[21] Appl. No.: 436,152

[22] Filed: Oct. 22, 1982

[51] Int. Cl.³ ............................................. H01P 3/18
[52] U.S. Cl. ................................. 333/238; 174/68.5; 29/829; 361/414
[58] Field of Search ...................... 174/68.5; 361/414; 333/236, 238, 246

[56] References Cited

U.S. PATENT DOCUMENTS

| | | | |
|---|---|---|---|
| 3,541,223 | 11/1970 | Helms | 361/414 X |
| 3,674,914 | 7/1972 | Burr | 174/68.5 |
| 3,691,563 | 9/1972 | Shelton | 333/238 X |
| 4,030,190 | 6/1977 | Varker | 29/625 |
| 4,097,684 | 6/1978 | Burr | 174/68.5 |
| 4,127,438 | 11/1978 | Babcock et al. | 156/666 |
| 4,328,531 | 5/1982 | Nagashima et al. | 361/414 X |

*Primary Examiner*—Paul Gensler
*Attorney, Agent, or Firm*—David D. Bahler; E. W. Galbi; J. Jancin, Jr.

[57] ABSTRACT

Multilayer printed circuit boards are designed and produced using a selective wiring technique which segregates short, medium length and long lines. By placing short medium length and long lines on different layers, line specifications can be relaxed for the layers with shorter lines. This relaxation of specifications allows for the effective use of subtractive, additive and encapsulated wire manufacturing techniques in the production of complex multilayer printed circuit boards. Each layer of segregated line lengths is fabricated in accordance with the appropriate technique for a given line length to obtain a multilayer printed circuit board optimized for cost and/or performance and reliability.

7 Claims, 2 Drawing Figures

SELECTIVE WIRING FOR MULTILAYER PRINTED CIRCUIT BOARD

DESCRIPTION

1. Technical Field

The present invention relates to a selective wiring process for multilayer printed circuit boards.

2. Background Art

The multilayer printed circuit board process disclosed in U.S. Pat. No. 4,030,190, illustrates the complexity that exists in large state-of-the-art multilayer printed circuit boards. As more functions are implemented on single multilayer boards, the number of layers and the density of lines on these layers dramatically increase. This increased density of lines has imposed limits on the use of fast and inexpensive subtractive etching techniques. Subtractive techniques involve coating a copper surface with photoresist, covering the photoresist with a mask of the circuit layout, and exposing the mask and photoresist to ultraviolet light causing the photoresist over the desired circuit lines to develop. Undeveloped photoresist areas are washed away, exposing the areas of unwanted copper which are subsequently removed by etching to leave the desired circuit lines.

The primary problem with the use of subtractive techniques is "under-cutting" which occurs when the etchant attacks the masked copper lines (e.g., circuit or interconnection lines) from the sides while unwanted copper is being removed from the layer. With the density of circuit lines increasing on the layers of complex multilayer printed circuit boards, narrower, thicker lines with precisely controlled dimensions are required. "Under-cutting" can thus destroy these lines by causing significant dimensional variations, or totally etching the lines away from the sides. Due to this problem other techniques have been developed and used in manufacturing complex multilayer printed circuit boards.

Encapsulated Wire techniques such as those described in U.S. Pat. Nos. 4,097,684 and 3,674,914, as well as additive techniques such as those described in U.S. Pat. No. 4,127,438 have been used as substitutes and/or supplements for the widely used subtractive technique.

In addition to greater density, a primary reason that the lines on complex multilayer circuit boards are required to be dimensionally precise is that several critical parameters including characteristic impedance, line resistance, noise coupling coefficient, etc. must be closely controlled if the circuits implemented on the multilayer printed board are to function properly. These parameters are to a major extent a function of line dimensions such as line thickness and line width, as well as line-to-line spacings.

Variations in line dimensions cause variations in the characteristic line impedance and variations in the D.C. resistance. When designing circuit boards parameters such as characteristic impedance and D.C. resistance are tightly specified. Generally these specifications must take into account the "worst case" condition. Generally, the worst case condition only occurs for the longest lines; however, all the lines on the circuit board are designed to the same tight specifications.

The noise coupling coefficient, is primarily a function of the line-to-line spacing on a layer and the distance of the lines from the reference planes. The closer together the lines of a given characteristic impedance are, the greater the noise coupling between the lines. For a given board configuration, the total coupled noise becomes a function of the length of parallel lines which occur during wiring. In general, the total coupled noise will be less for shorter lines than longer lines. As with characteristic impedance, a single acceptable range of line-to-line spacings and parallel line lengths is designated for all lines on the layer not-with-standing the fact that the effect of this parameter is dependent on the length of the particular line.

Even with the use of encapsulated wire and additive techniques, certain long-standing problems persist in manufacturing complex multilayer printed circuit boards. These include problems of long turn-around time, expense, reliability and yield. Furthermore, as lines get narrower increased incidences of open lines occur and tighter specifications on line dimensions and line-to-line spacings make it increasingly difficult to maintain a high yield.

When modules are interconnected on a printed circuit board a range of line lengths are present. A significant number of these interconnecting lines are short in length. These short lines are designed to the same specifications as are the longer lines. As the implementation of Large Scale Integration (LSI) technology proceeds, there is an increased concentration of communication between neighboring modules on multi-module printed circuit boards. This, in turn, means there is an increasing number of short lines on these printed circuit boards.

Using conventional multilayer printed circuit board techniques, these short lines would be interspersed on layers with longer lines with all the layers required to meet the same worst case specifications. This results in high cost, low yields, low reliability and long development and production time for complex multilayer printed circuit boards.

DISCLOSURE OF THE INVENTION

The present invention is directed to a selective wiring technique which segregates short lines from long lines. The short lines are placed onto one or more layers of the multilayer printed circuit board while the long lines are placed on other layers.

Circuits interconnected with short lines are less sensitive to variations in impedance and noise because reflections introduced during the signal transition period settle down much faster than in circuits interconnected with long lines. Thus circuit performance is less affected by the wider impedance and noise tolerances resulting from relaxed dimensions and tolerances on short lines. Similarly, a higher resistance is acceptable for short lines without affecting circuit performance. Thus, the shorter lines can be reduced in thickness facilitating fabrication by subtractive techniques with associated yield improvement and cost reduction. Even when the same fabrication technique is used for all lines, this reduction in line thickness for layers which contain shorter lines allow for relaxed tolerances amd reduced process time for the layers with the shorter, thinner lines.

In addition, three or more divisions of line lengths (e.g., further segregating medium length lines from short and long lines) may likewise prove beneficial depending on both the mix of line lengths present in a particular multilayer printed circuit board and whether a less expensive, faster, more reliable or higher yield fabrication technique exists for use in progressively longer interconnecting lines.

This invention can be used with the sequential type of process such as that shown in U.S. Pat. No. 4,030,190; or it can be used with a pin-parallel process wherein signal cores are first fabricated and then these cores are covered with epoxy pre-preg and laminated together with a ground or reference plane between them (and possibly also on the top and bottom of the resultant assembly).

DESCRIPTION OF THE PREFERRED EMBODIMENT

Figure 1:
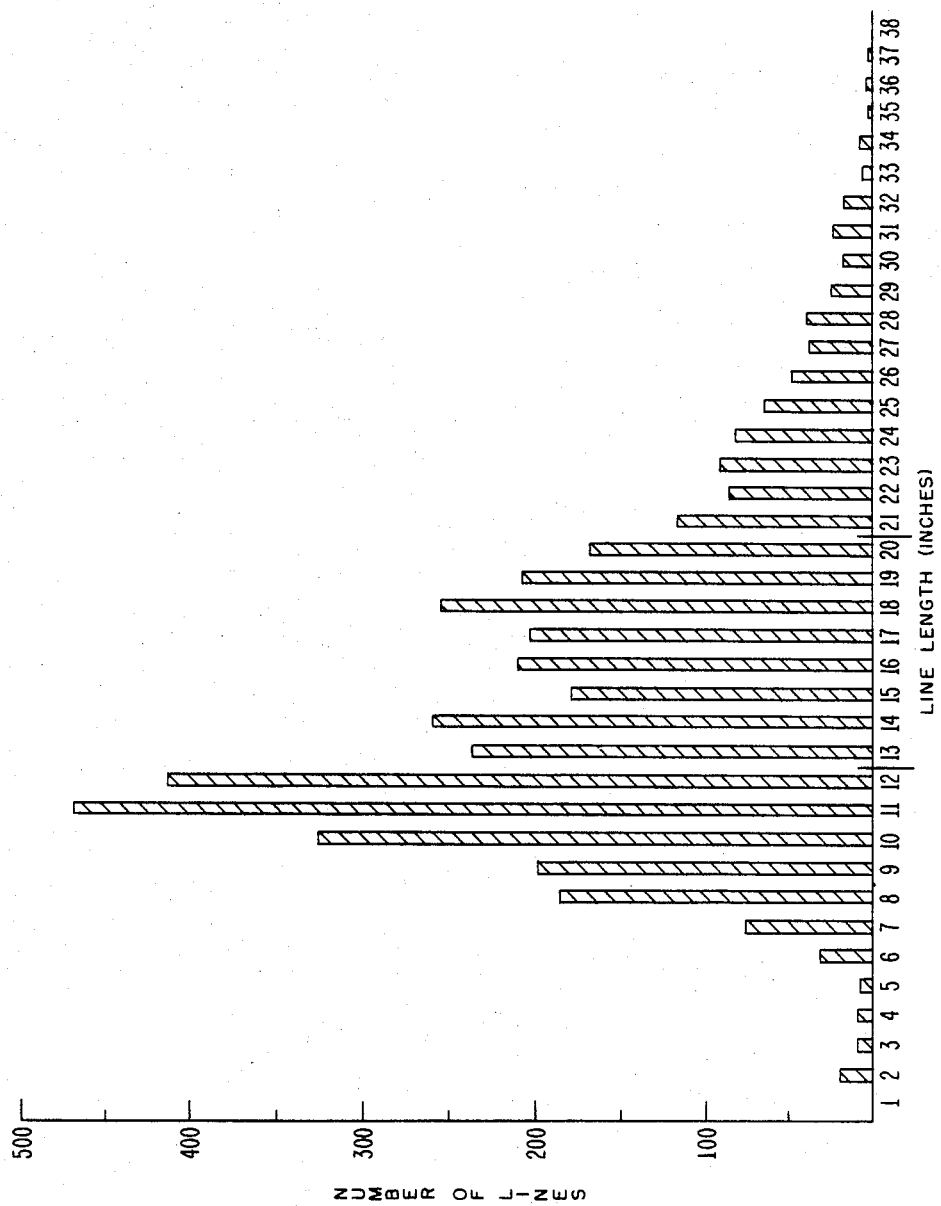
FIG. 1 is a graph of a distribution of interconnection line lengths on a typical signal layer in a complex multilayer printed circuit board prior to the present invention.

In the specific example shown in FIG. 1, 1778 of 4092 lines on the signal layer are under 12 inches in length (i.e., short lines). Another 1750 of the total of 4092 lines are between 12 and 20 inches (i.e., medium length lines), while the remaining 564 lines are longer than 20 inches (i.e., long lines). These numbers which are associated with the classification of line lengths as short, medium or long do not represent inflexible cut-offs. Rather they are merely used as representative examples for a typical distribution of line lengths present on a circuit board. In practice, the range of short, medium and long lines will adapt to the particular distribution present in the circuit board to be manufactured. For example, lines less than 12 inches could be placed on one layer while lines greater than or equal to 12 inches could be placed on a different layer. Furthermore, the term "line" is meant to encompass a line which connects not only two points but also a number of chained points (i.e., a connection from point one to point two is a single line as is a connection from point one to point two, to point three, point three to point four).

Following the prior art multilayer printed circuit board techniques worst case line tolerances specifications would be established for the longest line lengths and all 4092 lines would be built to these specification intermixed on one or more layers.

This would result in relatively long production times and high costs. Furthermore, yield would suffer due to the common stringent line tolerance specifications on all lines .

The present invention segregates these 4092 lines into two or more categories (e.g., short, medium length and long) such that the circuit board fabrication process is optimized with respect to cost, time, yield and reliability. A relatively inexpensive process such as a standard subtractive technique is used for short lines, while a high precision additive or encapsulated wire technique is used for producing medium and long line lengths. Cost is a major factor in determining whether additive or encapsualated wire is used for medium or long line lengths. Encapsulated wire techniques can be further enhanced by the use of an encapsulated wire coax conductor, thus providing all the advantages of a closely controlled impedance conductor, and making it particularly suited to long interconnection lengths.

The present invention will first be described as applied to a sequential process such as that shown in U.S. Pat. No. 4,030,190. Next the invention will be described as applied to a pin parallel process.

Figure 2:
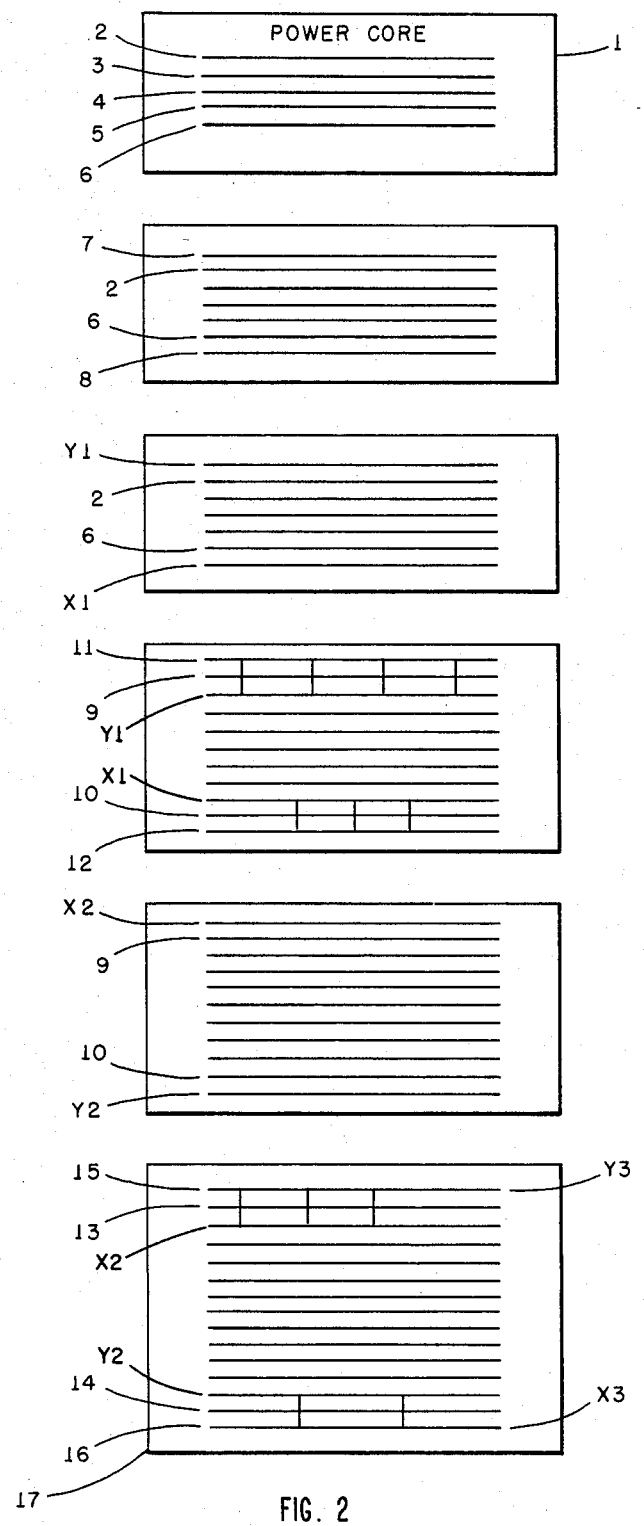
FIG. 2 is a diagram of the present inventive process for manufacturing a complex multilayer printed circuit board as well as the resultant configuration of the circuit board.

Referring now to FIG. 2, the sequential process for manufacturing a multilayer printed circuit board involves sequentially creating composite laminate 17 which consists of signal layers, dielectric layers and power layers. Each signal or power layer is separated from other signal or power layers by a dielectric layer. The dielectric material could be, for example, resin impregnated epoxy glass. The creation of power core 1 first involves the lamination of dielectric layers 2 and 4 to opposite sides of a power layer 3 (e.g., a sheet of copper). This is followed by lamination of another power layer 5 to dielectric layer 4 and a subsequent lamination of dielectric layer 6 to power layer 5.

Two copper layers 7 and 8 are then laminated onto dielectric layers 2 and 6 of power core 1. Signal layers Y1 and X1 are produced from copper layers 7 and 8, respectively. According to the present invention, signal layers Y1 and X1, have wide line tolerances in comparison to the line tolerances of signal layers Y2 and X2, Y3 and X3 described below. As a result, the characteristic impedance and noise coupling coefficients of the short lines on signal layers Y1 and X1 can vary over a relatively large range. This relaxation of line tolerance specifications and reduced thickness permit signal layers Y1 and X1 to be fabricated by subtractive techniques. Using subtractive techniques to produce signal layers with exclusively short lines and correspondingly relaxed line tolerances and line thickness substantially improves yields, reduce costs and production time when compared to multiwire, or additive techniques.

Once signal layers Y1 and X1 are produced, dielectric layers 9 and 10 are laminated onto signal layers Y1 and X1, respectively. Copper sheet 11 is then laminated onto dielectric sheet 9 and copper sheet 12 laminated onto dielectric sheet 10. Blind vias are drilled with a laser to provide via holes which connect copper sheet 11 to signal layer Y1 and copper sheet 12 to signal layer X2.

Following the laser drilling of blind vias, signal layers X2 and Y2 are produced from copper layers 11 and 12, respectively. Signal layers X2 and Y2 consist exclusively of medium length lines and are fabricated using additive techniques. Signal layers X2 and Y2 will have increased thickness and narrower line tolerances compared to the thickness and tolerances of the short line layers (Y1 and X1) and reduced thickness and wider tolerances than those for the long line layers (Y3 and X3) described below. Because the line tolerance specifications of medium lines are relaxed from those specifications required for long lines, less expensive and less time consuming techniques can be used to fabricate signal layers consisting of exclusively medium length lines than for those layers consisting of exclusively long lines. As a result of reduced line thickness and relaxed line tolerances relative to long line layers X3 and Y3, the characteristic impedance and noise coupling coefficients of the medium length lines on signal layers X2 and Y2 vary over a wider range than those for long lines. Yield enhancements therefore result from relaxed line tolerance specifications for medium length lines.

Once signal layers X2 and Y2 are produced, dielectric layers 13 and 14 are laminated to signal layers X2 and Y2, respectively, and in turn copper sheets 15 and 16 are laminated to dielectric layers 13 and 14. Blind holes are then laser drilled to provide via connections from copper layer 15 to signal layer X2 and from copper layer 16 to signal layer Y2. Signal layers Y3 and X3 are then produced from copper layers 15 and 16.

Signal layers Y3 and X3 consist exclusively of long lines requiring thicker lines than either the short or medium length lines to assure a low line resistance. Tighter tolerance specifications are also necessary to meet the lower impedance and noise coupling tolerance requirements dictated by the longer lines. This requires that additive techniques be used to fabricate these layers.

An alternative to fabricating the medium and long length lines by additive techniques is the use of encapsulated wire technology. Encapsulated wire technology is commercially available under the tradename Multiwire ( owned by the Kollmorgen Corporation). Trade-off analyses based on cost and/or performance for the various line length categories are required to determine the optimum solution for a specific printed circuit board. The use of coax encapsulated wire, although higher in cost than additive, also has a significant advantage particularly for long lines with respect to reduced noise coupling and reflections. Therefore, the resulting performance improvement can justify the added costs of coax encapsulated wire.

Segregating line lengths onto different layers of a multilayer printed circuit board has advantages over the prior art even if the same fabrication techniques are used to fabricate all the layers. This is because shorter lines can then be made thinner and narrower than longer lines (i.e., since long, medium and short lines are not on the same layer, they do not have to be the same thickness or width). For example, thin lines produced subtractively will have less undercutting resulting in inherently closer tolerance than thick lines produced with subtractive techniques. Consequently impedance and noise coefficient variations and tolerances for thin subtractive lines will be reduced over thick subtractive lines. Thus trade-offs can also be made with respect to line lengths for multilayer boards fabricated totally by subtractive etching techniques. The same advantages can be recognized when all layers are fabricated by additive techniques. By reducing the line dimensions of the shorter lines in this manner, line density on the layers with shorter lines will be increased. This results in the ability to accommodate the same number of lines on fewer layers.

Significant advantages can be realized in higher yields, lower cost and improved performance when line lengths of a printed circuit board are segregated into categories by reducing line thicknesses for shorter lines and/or applying alternate fabrication techniques to each line length category. By selecting the optimum fabrication technology for each line length category, and incorporating these as individual layers in the printed circuit board, trade-offs can be made to provide the optimum cost and/or performance and reliability for a given application.

The specific embodiment of the invention previously described utilized the sequential process. The present invention can also be practiced using the pin parallel process. The following is a description of how the present invention could be practiced using the pin parallel process. First signal cores would be formed. Each signal core would have two layers of circuitry separated by layers of dielectric material such as epoxy. The long lines would be placed on different signal cores than the short lines. Both layers of circuity on each signal core would have the same specifications and tolerances and be made by the same process. However, since the long lines are on different signal cores than the short lines, different signal cores could be made to different specifications. The specifications for the signal cores with the short lines would allow for relatively wide variations in the lines and the lines would be relatively wide, hence the cores with the short lines could be made by relatively inexpensive process steps. The signal cores with the long lines would have relatively tight specifications and hence these lines would have to be made by high precisions processes such as by high precison additive processes. Alternately, the signal cores with long lines could be made by encapsulated wire processes.

After the signal cores with the short lines and the signal cores with the long lines had been fabricated and tested, they would be covered by epoxy pre preg and laminated to a power plane or to a power core which would have multiple power planes. Power planes or power cores might also be laminated to the top and bottom of the assembly.

It is noted that the advantages of the present invention include the fact that the most complex and costly process is only used at the lowest level of assembly. Futhermore, all the signals lines can start and end on a module or I-O termination therefore the assembly is totally testable at a signal core level.

It is also noted that if the long lines are made by encapsulated wire technology they will have a relatively low ohmic resistance per unit length. The shorter lines can be produced by printed circuit technology with a smaller cross section; however, the resulting higher ohmic resistance per unit length of these will not significantly impair performance because the lines are short and their total resistance will be low.

Whereas we have illustrated and described the preferred embodiment of the invention, it is to be understood that we do not limit ourselves to the precise construction herein disclosed and the right is reserved to all changes and modifications coming within the scope of the inventions as defined by the appended claims.

I claim:

1. A multilayer printed circuit board optimized for fabrication including:
   at least one signal layer exclusively of short lines having a wide tolerance range for line dimensions and line-to-line spacings;
   at least one signal layer exclusively of long lines, each long line being longer than each short line, having a tolerance range in line dimensions and line-to-line spacings narrower than said wide tolerance range;
   at least one dielectric layer located between a signal layer of short lines and a signal layer of long lines;
   wherein the characteristic impedance and noise coupling coefficients of the short lines vary over a large range and the characteristic impedance and noise coupling coefficients of the long lines vary over a range smaller than said large range.

2. A multilayer printed circuit board according to claim 1 wherein different fabrication techniques are used to produce said at least one signal layer exclusively of short lines and said at least one signal layer exclusively of long lines.

3. A multilayer printed circuit board optimized for fabrication including:

at least one signal layer exclusively of short lines having a wide tolerance range in line dimensions and line-to-line spacings;

at least one signal layer exclusively of long lines, each long line being longer than each short line, having a narrow tolerance range, narrower than said wide tolerance range, in line dimensions and line-to-line spacings;

at least one signal layer exclusively of medium length lines, each medium length line being longer than each short line and shorter than each long line, having a tolerance range in line dimensions and line-to-line spacings narrower than said wide tolerance range and wider than said narrow tolerance range;

at least one dielectric layer located between a signal layer of short lines and a signal layer of medium length lines;

at least one dielectric layer located between a signal layer of medium length lines and a signal layer of long lines;

wherein the characteristic impedance and noise coupling coefficients of the short lines vary over a large range, the characteristic impedance and noise coupling coefficients of the long lines vary over a small range, smaller than said large range, and the characteristic impedance and noise coupling coefficients of the medium length lines vary over a range larger than said small range and smaller than said large range.

4. A multilayer printed circuit board optimized for fabrication comprising:

at least two types of signal layers each characterized by the line lengths present exclusively on that particular signal layer; signal layers exclusively with shorter lines having wider tolerances for line dimensions and line-to-line spacings than signal layers exclusively with longer lines;

at least one dielectric layer located between any two adjacent signal layers;

wherein the characteristic impedance and noise coupling coefficient of the signal layers with shorter lines vary over a wider range than the signal layers with longer lines.

5. A multilayer printed circuit board optimized for fabrication including:

at least one signal layer exclusively of lines less than twelve inches in length having a wide tolerance range for line dimensions and line-to-line spacings;

at least one signal layer exclusively of lines greater than or equal to twelve inches in length having a tolerance range in line dimensions and line-to-line spacings narrower than said wide tolerance range;

at least one dielectric layer located between a signal layer of lines less than twelve inches in length and a signal layer of lines greater than or equal to twelve inches in length;

wherein the characteristic impedance and noise coupling coefficients of the lines less than twelve inches in length vary over a large range and the characteristic impedance and noise coupling coefficients of the lines greater than or equal to twelve inches in length vary over a range smaller than said large range.

6. A multilayer printed circuit board optimized for fabrication including:

at least one signal layer exclusively of lines less than twelve inches in length having a wide tolerance range in line dimensions and line-to-line spacings;

at least one signal layer exclusively of lines more than twenty inches in length having a narrow tolerance range, narrower than said wide tolerance range, in line dimensions and line-to-line spacings;

at least one signal layer exclusively of lines between twelve and twenty inches in length having a tolerance range in line dimensions and line-to-line spacings narrower than said wide tolerance range and wider than said narrow tolerance range;

at least one dielectric layer located between a signal layer of lines less than twelve inches in length and a signal layer of lines between twelve and twenty inches in length;

at least one dielectric layer located between a signal layer of lines between twelve and twenty inches in length and a signal layer of lines greater than twenty inches in length;

wherein the characteristic impedance and noise coupling coefficients of the lines less than twelve inches in length vary over a large range, the characteristic impedance and noise coupling coefficients of the lines greater than twenty inches in length vary over a small range, smaller than said large range, and the characteristic impedance and noise coupling coefficients of the lines between twelve and twenty inches in length vary over a range smaller than said large range and larger than said small range.

7. A multilayer printed circuit board optimized for fabrication including a first signal core exclusively having short signal lines with a wide tolerance range in the characteristic impedance and noise coupling coefficients of the signal lines, a second signal core exclusively having long signal lines, each long line being longer than each short line, with a tolerance range in the characteristic impedance and noise coupling coefficients of the signal lines narrower than said wide tolerance range, a reference plane between said signal cores, and dielectric layers between said signal cores and said reference plane.

* * * * *